US009267701B2

(12) United States Patent
Purnell

(10) Patent No.: US 9,267,701 B2
(45) Date of Patent: Feb. 23, 2016

(54) TEMPERATURE CONTROL SYSTEM FOR A CONTROLLED ENVIRONMENTAL VAULT

(76) Inventor: Thomas L Purnell, Genoa City, WI (US)

(*) Notice: Subject to any disclaimer, the term of this patent is extended or adjusted under 35 U.S.C. 154(b) by 224 days.

(21) Appl. No.: 13/281,164

(22) Filed: Oct. 25, 2011

(65) Prior Publication Data

US 2012/0097747 A1   Apr. 26, 2012

Related U.S. Application Data

(60) Provisional application No. 61/406,484, filed on Oct. 25, 2010.

(51) Int. Cl.
| | |
|---|---|
| *F24F 1/38* | (2011.01) |
| *F24F 1/06* | (2011.01) |
| *F24F 13/20* | (2006.01) |
| *F24F 11/00* | (2006.01) |
| *F04D 29/42* | (2006.01) |
| *H05K 7/20* | (2006.01) |

(52) U.S. Cl.
CPC .......... *F24F 11/006* (2013.01); *F04D 29/4226* (2013.01); *F24F 1/06* (2013.01); *F24F 1/38* (2013.01); *F24F 13/20* (2013.01); *H05K 7/2059* (2013.01)

(58) Field of Classification Search
CPC ..... H05K 9/0041; H05K 7/20; H05K 9/0024; H05K 7/2059; F28D 15/0275; F24F 11/006; F24F 1/38; F24F 1/06; F24F 1/0022; F24F 2011/0002; F24F 2013/205; F24F 13/20; F04D 29/4226
USPC ........ 62/404, 259.1, 262, 263, 298, 428, 426; 236/49.1; 454/275–277, 284, 287, 291; 165/51

See application file for complete search history.

(56) References Cited

U.S. PATENT DOCUMENTS

| | | | | |
|---|---|---|---|---|
| 2,896,428 | A * | 7/1959 | Paton | F24F 1/02 165/48.1 |
| 5,297,004 | A * | 3/1994 | Mazura | 361/690 |
| 5,685,166 | A * | 11/1997 | Li | 62/428 |
| 5,927,386 | A * | 7/1999 | Lin | 165/80.3 |
| 6,098,415 | A * | 8/2000 | Correa | F24F 1/0003 62/286 |
| 6,196,013 | B1 * | 3/2001 | Kim | F24F 1/027 62/262 |
| 2004/0074100 | A1 * | 4/2004 | Polk, Jr. | 33/562 |
| 2006/0148399 | A1 * | 7/2006 | Su | 454/184 |
| 2007/0028638 | A1 * | 2/2007 | Eom | F24F 1/027 62/262 |
| 2007/0066215 | A1 * | 3/2007 | Song | B01D 46/0004 454/329 |
| 2011/0266046 | A1 * | 11/2011 | Hsieh et al. | 174/382 |

FOREIGN PATENT DOCUMENTS

EP            1515095 A1 *   3/2005   ............ F24F 1/0007

* cited by examiner

*Primary Examiner* — Frantz Jules
*Assistant Examiner* — Martha Tadesse
(74) *Attorney, Agent, or Firm* — Valauskas Corder LLC

(57) ABSTRACT

A temperature control system for a controlled environmental vault including an indoor unit and an outdoor unit of a split-type room air conditioner that comprises a mounting component, shroud component, and a shroud cover component. The shroud component and shroud cover component are configured to be installed on the outdoor unit to effectively divert hot exhaust air from the outdoor unit to outside the controlled environmental vault. The mounting component assembles to the indoor unit such that the indoor unit can be secured to an architectural structure such as a ceiling joist or ceiling rafter.

3 Claims, 5 Drawing Sheets

TEMPERATURE CONTROL SYSTEM FOR A CONTROLLED ENVIRONMENTAL VAULT

This application claims the benefit of U.S. Provisional Patent Application No. 61/406,484 filed Oct. 25, 2010.

FIELD OF THE INVENTION

The present invention relates generally to heating, ventilation, and air conditioning ("HVAC") systems, and in particular, the present invention relates to HVAC systems in controlled environmental vaults.

BACKGROUND OF THE INVENTION

A Controlled Environmental Vault ("CEV") is a hut, enclosure, or box-like structure that encloses and protects infrastructure. Usually, CEVs enclose and protect infrastructure pertaining to communication equipment, such as telephone, Internet, computer, or surveillance equipment. CEVs include temperature control equipment in order to maintain one or more specified temperatures and reduce the likelihood of damage to infrastructure within the CEV. Temperature control equipment includes, for example, heating, ventilation, and air conditioning ("HVAC") systems, dehumidifiers, fresh air blowers, environment monitors and alarms, and electrical control panels and outlets.

CEVs are typically fabricated from materials including steel, concrete, or aluminum and may be completely or partially buried (underground) or entirely above ground. Usually, an entry hatch provides access to the CEV.

Most CEVs that enclose and protect communication equipment include a traditional air conditioning system. Traditional air conditioning systems in CEVs are inefficient and expensive to maintain. In addition, many replacement parts are no longer manufactured or difficult to obtain. For example, compressors for traditional air conditioning systems found in CEVs are no longer manufactured. Therefore, replacement compressors must be entirely rebuilt. This repair is not cost effective since rebuilt compressors can cost thousands of dollars for parts and labor. Furthermore, rebuilt compressors tend to experience an increased failure rate.

There is a demand for a temperature control system for a CEV that is more efficient than currently installed systems and furthermore, that minimizes maintenance, energy cost, and repair cost. The present invention satisfies this demand.

SUMMARY OF THE INVENTION

The present invention is a temperature control system for a controlled environmental vault ("CEV"). The temperature control system replaces traditional air conditioning systems used in CEVs to regulate air temperature in order to reduce the likelihood of damage to infrastructure such as communication equipment contained within the CEV.

The temperature control system of the present invention utilizes a split-type room air conditioner such as those manufactured by Fujitsu, LG, Mitsubishi, and Sanyo, to name a few. Split-type room air conditioners are quiet, powerful, and, most importantly, compact. A split-type room air conditioner is ductless and includes an indoor unit and an outdoor unit. The indoor unit—also referred to as a coil unit or a head unit—is an air handler that takes air from the environment and dispenses newly-cooled air back into the environment. The outdoor unit—also referred to a as condenser unit—supplies the indoor unit with coolant.

A disadvantage of a split-type room air conditioner is that it is not configured to be used within a CEV. Particularly, the indoor unit includes a wall mount configuration such that it is not intended to mount the indoor unit to ceilings. Furthermore, the outdoor unit fails to enable the proper air flow as required by the split-type room air conditioner.

Accordingly, one embodiment of the present invention comprises a mounting component designed to facilitate positioning the indoor unit in a configuration other than that as intended by the manufacturer of the slit-type room air conditioner. For example, in one embodiment, the mounting component facilitates positioning of the indoor unit on a ceiling of a CEV. Specifically, the mounting component facilitates mounting the indoor unit to an architectural structure of a ceiling such as a joist, I-beam, or rafter, to name a few. The mounting component permits an alternative mounting configuration of the indoor unit. The mounting component may be fabricated from any material such as sheet metal, aluminum, steel, plastic, or any other material that can support the indoor component when mounted from a ceiling of the CEV. It is contemplated that the mounting component is configured so that parts (e.g., drain hose, piping, line sets) of the indoor unit are not obstructed and have proper space for placement.

One embodiment of the present invention may also comprise a shroud component including a shroud cover component such that the outdoor unit functions as intended without over-heating. Specifically, the shroud component and shroud cover component are designed to facilitate the proper air flow by diverting the air expelled from a fan of the outdoor unit away from the ambient air present within the CEV. More specifically, the air is diverted outside the CEV. The shroud component including a shroud cover component prevents hot exhaust air from mixing with cool intake air, which increases efficiency and enables proper installation of the temperature control system according to the present invention.

More specifically, the outdoor unit is located in a chamber within the CEV separate and apart from a chamber in which the indoor unit is located. The shroud component and shroud cover component act to separate the chamber in which the outdoor unit is located into two parts—one for cool intake air (intake chamber) and the other for hot exhaust air (exhaust chamber). The shroud component and shroud cover component may be fabricated from any material such as sheet metal, aluminum, steel, plastic, or any other material that can divert hot air without warping the shroud component or shroud cover component.

The temperature control system of the present invention may include one or more outdoor units working in conjunction with one or more indoor units. For example, one embodiment of the temperature control system may include one indoor unit and two outdoor units, which may be located side-by-side or stacked one on top of the other.

The temperature control system of the present invention is more efficient than traditional air conditioning systems currently used in certain CEVs. Furthermore, it is contemplated that the present invention may use 410A Freon as a coolant, which is better for the environment as compared to other coolants.

The described embodiments are to be considered in all respects only as illustrative and not restrictive, and the scope of the invention is not limited to the foregoing description. Those of skill in the art will recognize changes, substitutions and other modifications that will nonetheless come within the scope of the invention and range of the claims.

DESCRIPTION OF THE DRAWING

The preferred embodiments of the invention will be described in conjunction with the appended drawing provided to illustrate and not to the limit the invention, where like designations denote like elements, and in which.

DETAILED DESCRIPTION OF THE INVENTION

Figure 1:
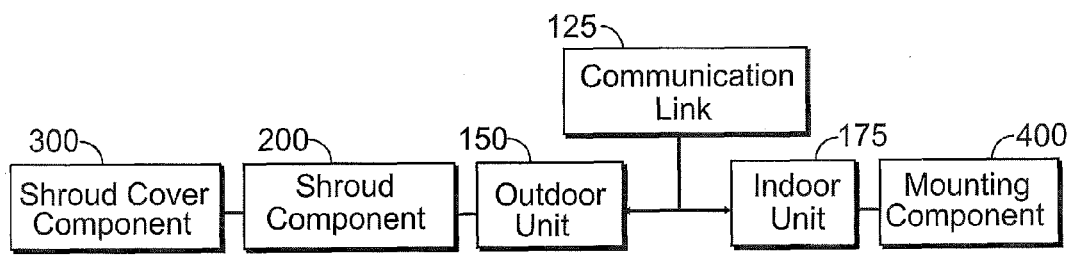
FIG. 1 illustrates a block diagram of the components according to one embodiment of the present invention.

FIG. 1 illustrates a block diagram 100 of the components which may be installed within a CEV according to one embodiment of the present invention. The split-type room air conditioner includes an indoor unit 175 and an outdoor unit 150 connected to one another through a communication link 125. The communication link 125 includes one or more electrical connections and power supply.

The indoor unit 175 is installed in the CEV near the communication equipment in order to regulate the temperature and reduce the likelihood of damage to the equipment within the CEV. The present invention contemplates communication equipment including that typically used for telephone or Internet service provided by carriers such as AT&T, Quest, T-Mobile, Verizon, and Southwest, to name a few. According to the present invention, the indoor unit 175 comprises a mounting component 400 to facilitate mounting the indoor unit 175 within a CEV such as to a ceiling rafter.

The outdoor unit 150 is located in a chamber within the CEV separate and apart from a chamber in which the indoor unit 175 is located. More specifically, the outdoor unit 150 is installed remotely from the communication equipment. Typically, the outdoor unit 150 is installed in a chamber of the CEV that is more accessible than the chamber of the CEV in which the indoor unit 175 is installed.

The outdoor unit 150 comprises a shroud component 200 including a shroud cover component 300. The shroud component 200 and shroud cover component 300 act to separate the chamber in which the outdoor unit is located into two parts—one for cool intake air (intake chamber) and the other for hot exhaust air (exhaust chamber). The shroud component 200 and shroud cover component 300 facilitate the proper air flow by diverting the air expelled from the outdoor unit 150 away from the ambient air present within the CEV in order for the outdoor unit 150 to function as intended.

Figure 2A:
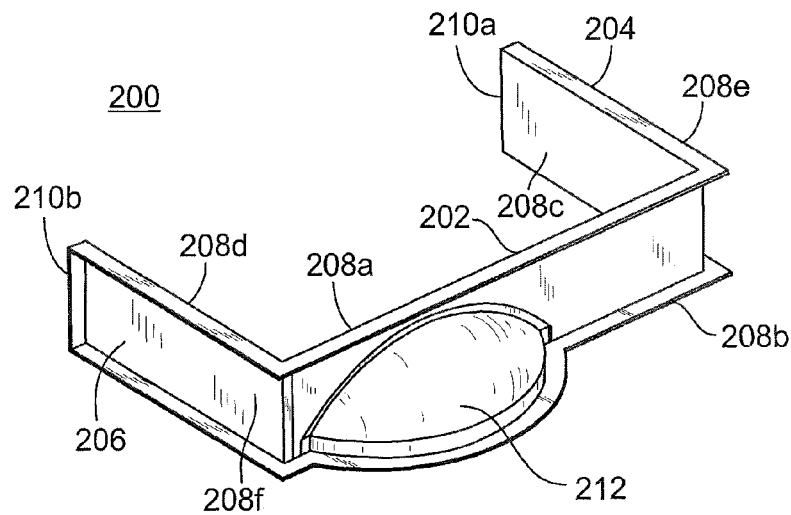
FIGS. 2A and 2B illustrates a shroud component according to one embodiment of the present invention.
Figure 2B:
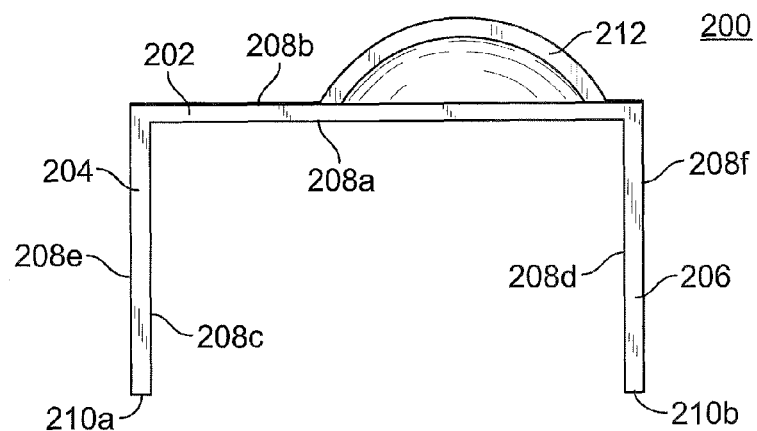

FIGS. 2A and 2B illustrate a shroud component 200 according to one embodiment of the present invention. The shroud component 200 includes a base member 202 and a first border member 204 and a second border member 206. The base member 202 includes a bulge element 212 that is generally semi-circular in shape to frame the fan 152 of the outdoor unit 150; however, any shape bulge element 212 is contemplated. The bulge element 212 assists in diverting hot air expelled from the fan 152 of the outdoor unit 150. More specifically, the base member 202 includes an interior surface 208a and an exterior surface 208b.. Likewise, the first border member 204 and second border member 206 each include an interior surface 208c, 208d and exterior surface 208e, 208f, respectively. The first border member 204 and second border member 206 further include a first edge 210a and second edge 210b, respectively.

Figure 3:
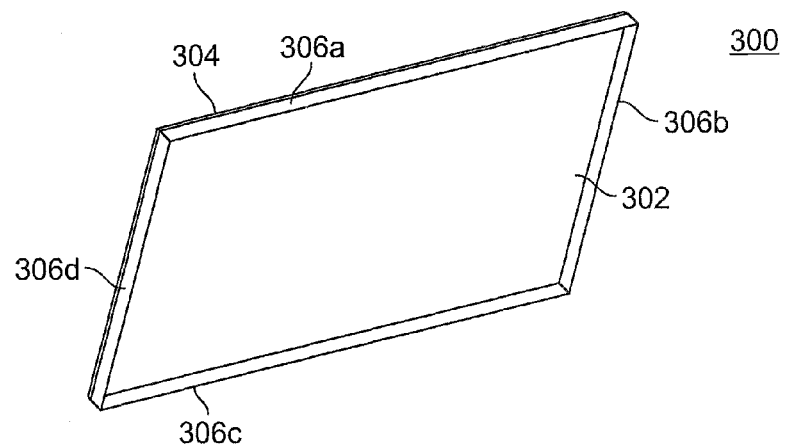
FIG. 3 illustrates a shroud cover component according to one embodiment of the present invention.

FIG. 3 illustrates a shroud cover component 300 according to one embodiment of the present invention. The shroud cover component 300 includes a top surface 302 and a bottom surface 304. The top surface 302 and bottom surface 304 are defined by four periphery members: a first periphery member 306a, a second periphery member 306b, a third periphery member 306c, and a fourth periphery member 306d. Although the shroud cover component 300 is illustrated as a rectangular shape in FIG. 3, any shape for the shroud cover component 300 is contemplated.

Figure 4:
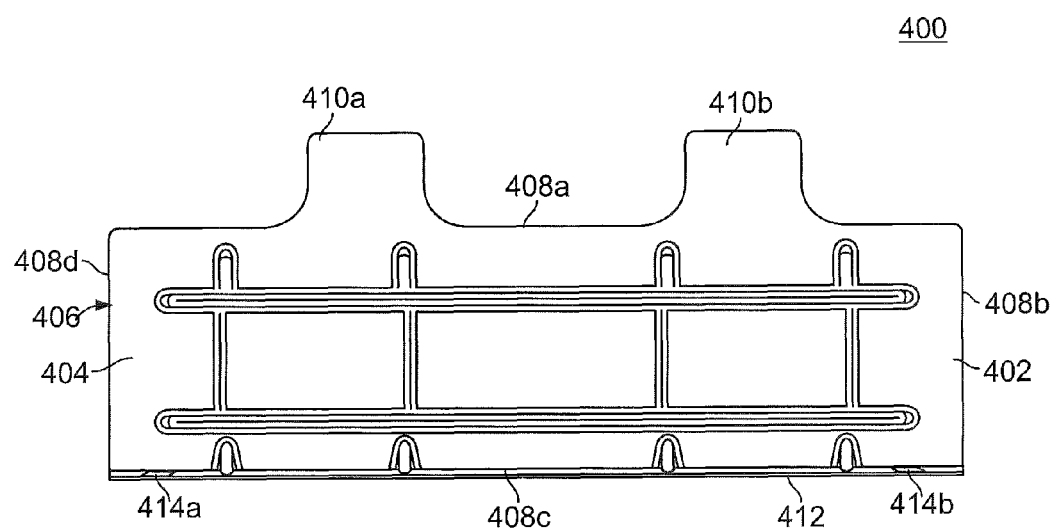
FIG. 4 illustrates a mounting component according to one embodiment of the present invention.

FIG. 4 illustrates a mounting component 400 according to one embodiment of the present invention. The mounting component 400 includes a platform element 402 including a first face 404 and opposing second face 406. More specifically, the mounting component 400 is defined by four borders: a first border 408a, a second border 408b, a third border 408c, and a fourth border 408d. The platform element 402 includes a first tab portion 410a and a second tab portion 410b that extend from border 408a. It is contemplated that tab portions 410a, 410b align with the indoor unit 175, specifically the rear bracket of the indoor unit 175, such that parts such as drain hose, piping, line sets of the indoor unit are not obstructed and have proper space for placement. The mounting component 400 further includes a brace portion 412 extending perpendicular from border 408c. Brace portion 412 includes a first securement aperture element 414a and a second securement aperture element 414b. The aperture elements 414a, 414b facilitate attachment of the indoor unit 1775 to an architectural structure such as that found in or on a ceiling.

Figure 5:
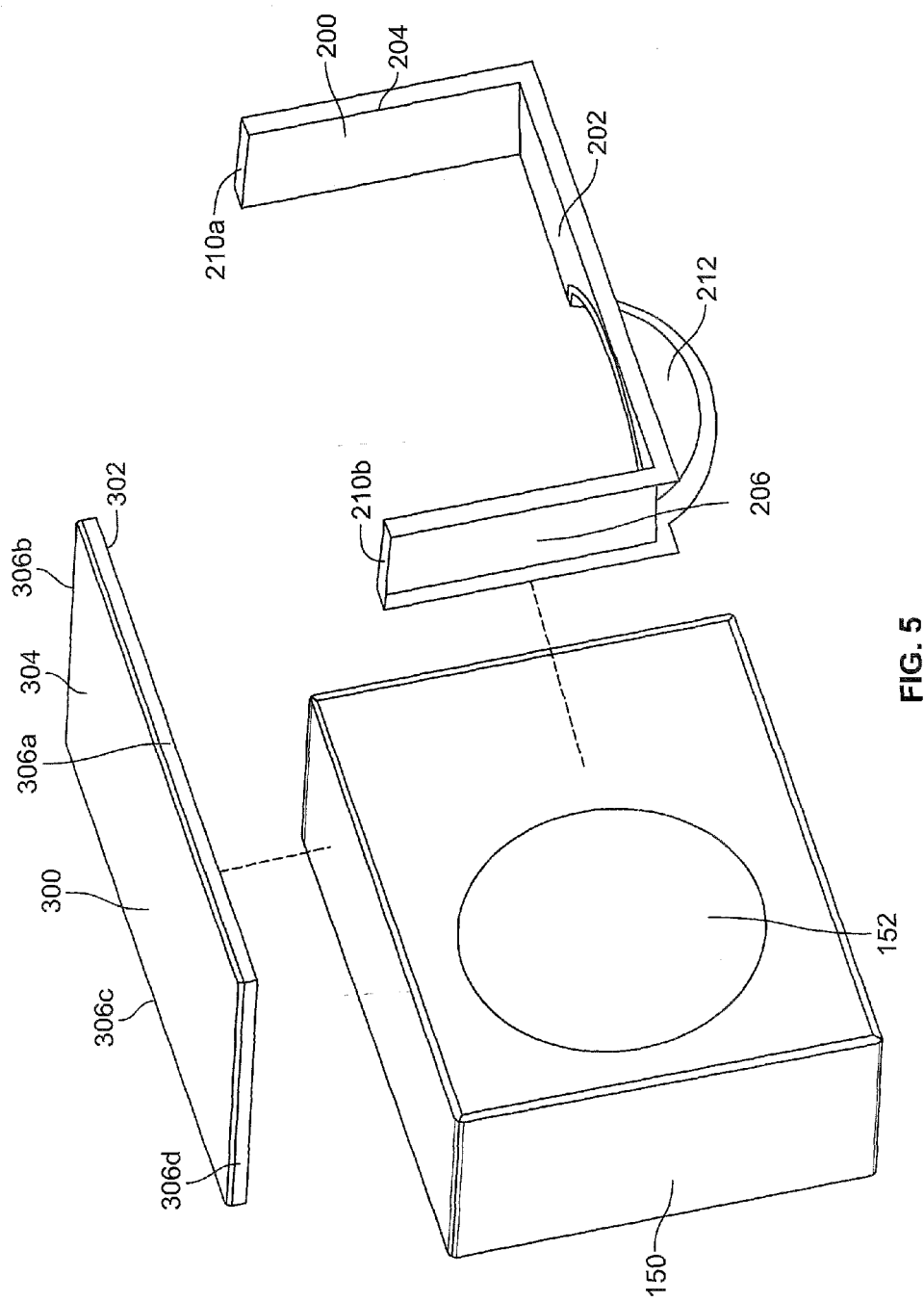
FIG. 5 illustrates an assembly view of an outdoor unit including shroud component and shroud cover component according to one embodiment of the present invention.

FIG. 5 illustrates an assembly view of an outdoor unit 150 including shroud component 200 and shroud cover component 300 according to one embodiment of the present invention. The shroud component 200 is positioned on the outdoor unit 150 such that the bulge element 212 frames the fan 152. When properly positioned, the base member 202 aligns with the bottom of the outdoor unit 150 and the first border member 204 and the second border member 206 of the shroud component 200 align with the sides of the outdoor unit 150 as shown in FIG. 5. Furthermore, the first edge 210a and second edge 210b of the first border member 204 and second border member 206, respectively, align with the top of the outdoor unit 150. The shroud component 200 may be installed on the outdoor unit 150 using any type of fastener such as screws, bolts, or nails.

The shroud cover component 300 is positioned over the top of the outdoor unit 150. Once positioned, the shroud cover component 300 covers the top of the outdoor unit 150 as well as complements the shroud component 200. Specifically, the bottom surface 304 of the shroud cover component 300 rests upon the first edge 210a and the second edge 210b of the shroud component 200. The shroud cover component 300 may be installed on the outdoor unit 150 by setting it over the top of the outdoor unit 150 or by using any type of fastener such as screws, bolts, or nails.

The shroud component 200 and shroud cover component 300 enclose the fan 152 of the outdoor unit 150 to divert hot air expelled from the fan 152. Specifically, air expelled from a fan 152 of the outdoor unit 150 is diverted away from the ambient air present within the CEV and outside the CEV.

Figure 6:
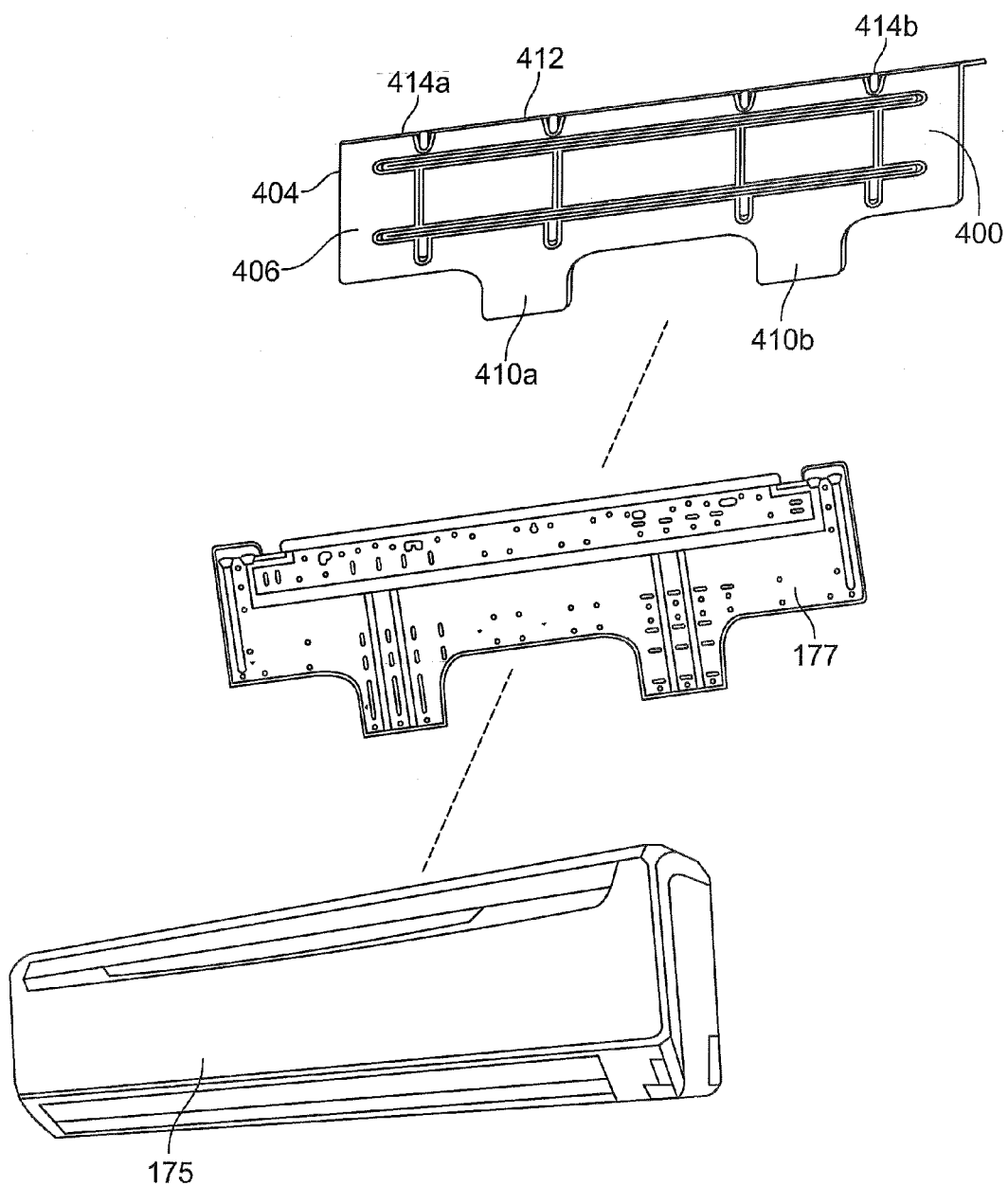
FIG. 6 illustrates an assembly view of an indoor unit including mounting component according to one embodiment of the present invention.

FIG. 6 illustrates an assembly view of an indoor unit 175 including mounting component 400 according to one embodiment of the present invention. The mounting component 400 facilitates positioning the indoor unit 175 in a configuration other than that as intended by the manufacturer of the slit-type room air conditioner. For example, in one embodiment, the mounting component 400 facilitates positioning of the indoor unit 1775 on a ceiling of a CEV.

The indoor unit 175 includes a rear bracket 177 as provided by the manufacturer for mounting the indoor unit 175. The mounting component 400 is assembled to the rear bracket 177 of the indoor unit 175 such that the tab portions 410a, 410b of the mounting component 400 align with the rear bracket 177 of the indoor unit 175. Tab portions 410a, 410b allow parts such as the drain hose, piping, and line sets of the indoor unit 175 to remain un-obstructed once the indoor unit 175 including mounting component 400 is installed. Specifically, the second face 406 of the platform element 402 abuts the rear bracket 177 such that the brace portion 412 extends from the indoor unit 175. The first securement aperture element 414a and the second securement aperture element 414b are used to secure the indoor unit 175 to an architectural structure, particularly an architectural structure such as a joist, I-beam, or rafter located on the ceiling of a CEV. Specifically, fasteners such as screws, bolts, or nails are used through the securement aperture elements 414a, 414b to secure the indoor unit 175.

Figure 7:
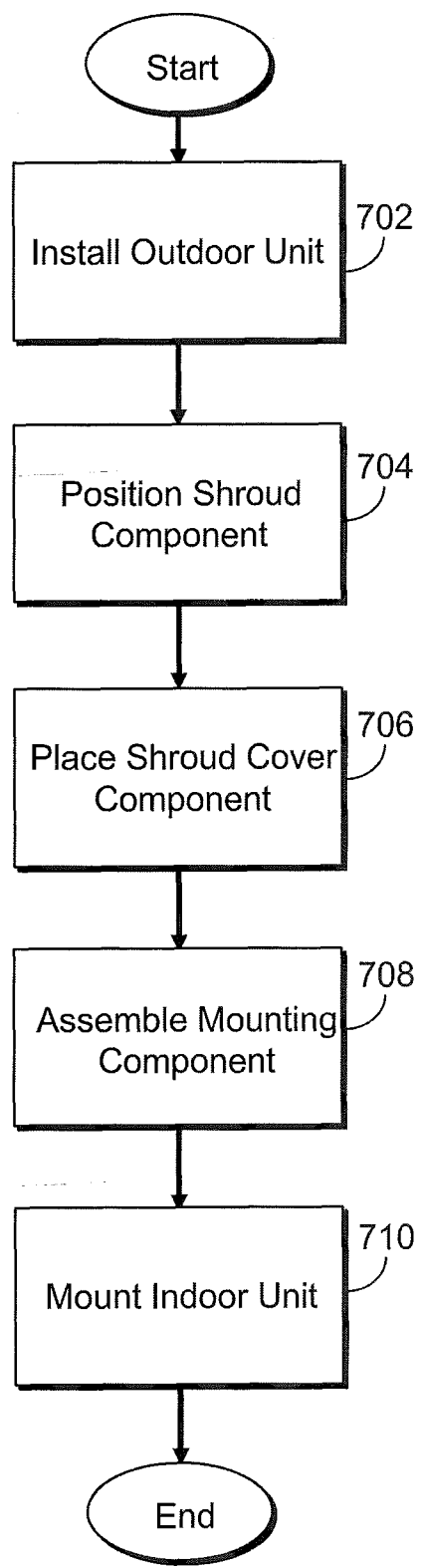
FIG. 7 illustrates a flow chart directed to the assembly of the components according to one embodiment of the present invention.

FIG. 7 illustrates a flow chart directed to the assembly 700 of the components according to one embodiment of the present invention. The outdoor unit is installed according to the manufacturer's intended installation procedure at step 702. According to step 704, the shroud component is positioned on the outdoor unit. Specifically, the shroud component is positioned such that the bulge element aligns with the fan of the outdoor unit. The shroud cover component is positioned at step 706. The shroud cover component is positioned over the top of the outdoor unit as well as over the first edge and second edge of the shroud component, thereby effectively forming an enclosure with four sides integrated with the outdoor unit. At step 708, the mounting component is assembled to the indoor unit. Specifically, the mounting component is attached to the rear bracket of the indoor unit. Once the mounting component is attached to the rear bracket, the indoor unit is installed at step 710 by securing the mounting component to an architectural structure such as a ceiling joist.

The embodiments described herein are to be considered in all respects only as illustrative and not restrictive, and the scope of the invention is not limited to the foregoing description. Those of skill in the art will recognize changes, substitutions and other modifications that will nonetheless come within the scope of the invention and range of the claims.

What is claimed is:

1. A temperature control system for a controlled environmental vault including an indoor unit and an outdoor unit having a fan of a split-type room air conditioner, comprising:
   a shroud component comprising a first border member, a second border member, and a base member, the single continuous bulge element protruding from the base member and generally semi-circular in shape, wherein the shroud component is assembled to the outdoor unit such that the single continuous bulge element is positioned directly in front of a blade portion of the fan of the outdoor unit;
   a shroud cover component comprising a first periphery member, a second periphery member, a third periphery member and a fourth periphery member, the periphery members defining a top surface and a bottom surface, wherein the shroud cover component is installed on the outdoor unit such that the shroud cover component and the shroud component divert exhaust air from the outdoor unit to outside the controlled environmental vault; and
   a mounting component comprising a first border, a second border, a third border and a fourth border, the borders defining a first face and a second face, wherein the mounting component is assembled to the indoor unit.

2. The temperature control system for a controlled environmental vault including an indoor unit and an outdoor unit of a split-type room air conditioner according to claim 1, wherein the mounting component further comprises a first tab portion and a second tab portion, the tab portions extending from the first border.

3. The temperature control system for a controlled environmental vault including an indoor unit and an outdoor unit of a split-type room air conditioner according to claim 1, wherein the mounting component further comprises a brace portion extending perpendicular from the third border.

* * * * *